(12) United States Patent
Tsai

(10) Patent No.: US 7,241,541 B2
(45) Date of Patent: Jul. 10, 2007

(54) METHOD OF THE ADJUSTABLE MATCHING MAP SYSTEM IN LITHOGRAPHY

(75) Inventor: Fei-Gwo Tsai, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 11/563,837

(22) Filed: Nov. 28, 2006

(65) Prior Publication Data

US 2007/0099098 A1    May 3, 2007

Related U.S. Application Data

(62) Division of application No. 10/725,810, filed on Dec. 2, 2003, now Pat. No. 7,160,654.

(51) Int. Cl.
*G03C 5/00* (2006.01)
*G03F 9/00* (2006.01)

(52) U.S. Cl. ............... 430/22; 430/30; 430/312; 430/313; 430/329; 430/396

(58) Field of Classification Search ............ 430/22, 430/30, 312, 313, 329, 396
See application file for complete search history.

(56) References Cited

U.S. PATENT DOCUMENTS

| 4,929,083 | A | | 5/1990 | Brunner |
| 5,044,750 | A | | 9/1991 | Shamble |
| 5,498,500 | A | * | 3/1996 | Bae .......................... 430/22 |
| 5,989,761 | A | * | 11/1999 | Kawakubo et al. ............ 430/22 |
| 6,288,556 | B1 | | 9/2001 | Sato et al. |
| 6,342,323 | B1 | | 1/2002 | Ma et al. |
| 6,352,323 | B1 | | 3/2002 | Rives |
| 7,014,965 | B2 | * | 3/2006 | Liao et al. ..................... 430/30 |
| 7,160,654 | B2 | * | 1/2007 | Tsai ............................ 430/22 |

* cited by examiner

*Primary Examiner*—Christopher G. Young
(74) *Attorney, Agent, or Firm*—Thomas, Kayden, Horstemeyer & Risley

(57) ABSTRACT

A method is provided for improving layer to layer overlay of a second layer pattern on a first layer pattern formed in a substrate. A plurality of first reference marks is placed inside a pattern area on a first layer mask which is used to form the first layer pattern. A plurality of second reference marks is placed on a second layer mask which is used to form the second layer pattern and in which one second reference mark is matched with a first reference mark having the same (x,y) coordinates. Reference mark placement in the resulting first and second layer patterns is determined by metrology to determine an x-deviation and a y-deviation for each matched pair of reference marks. A correction algorithm is then used to calculate adjustments in exposure tool settings for improved overlay of the second layer pattern on the first layer pattern in subsequent exposures.

12 Claims, 7 Drawing Sheets

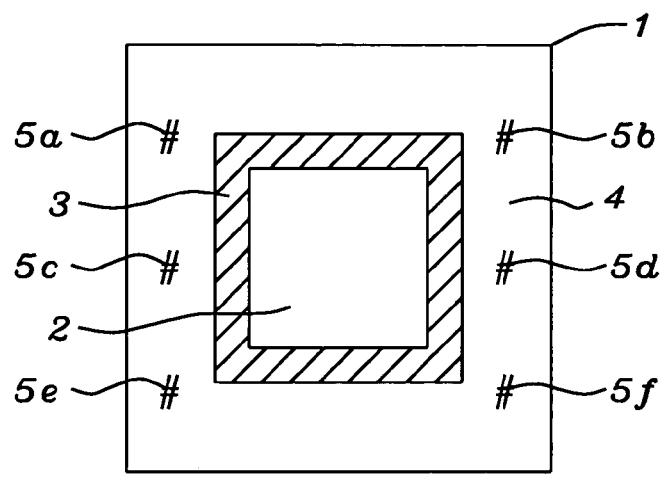
*FIG. 1 - Prior Art*
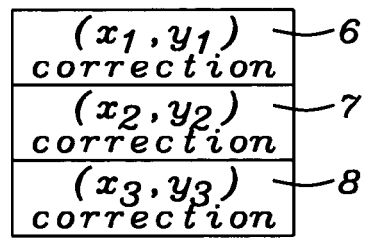
*FIG. 2 - Prior Art*
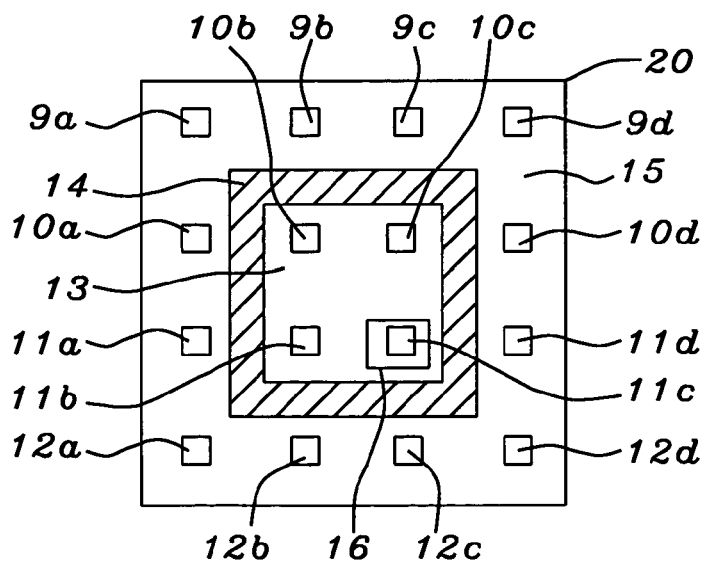
*FIG. 3*

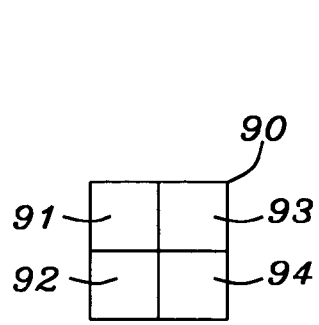
FIG. 11a
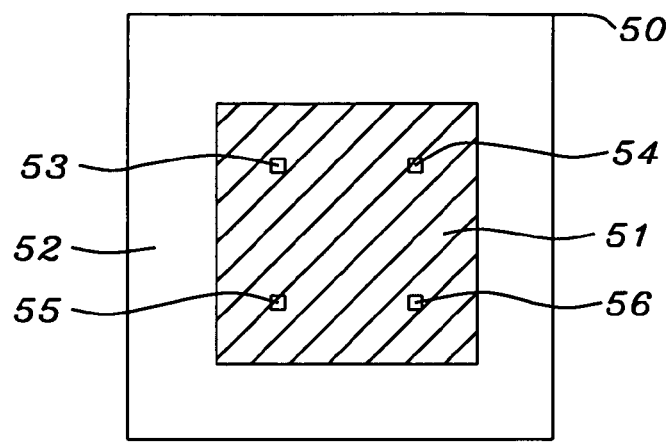
FIG. 11b
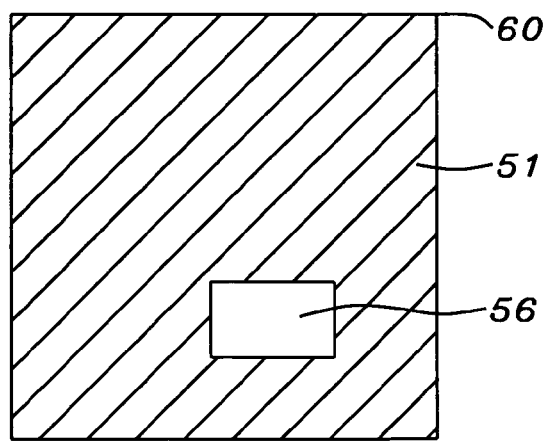
FIG. 12
FIG. 13

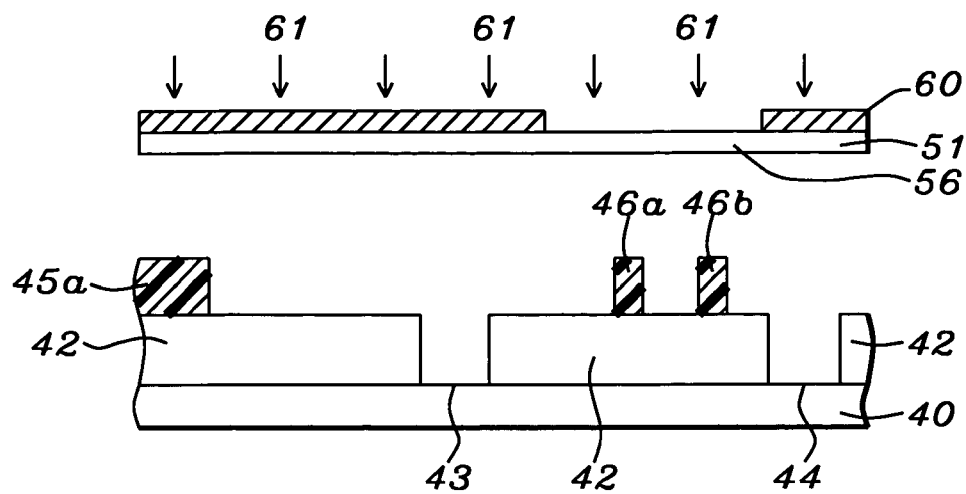
FIG. 14
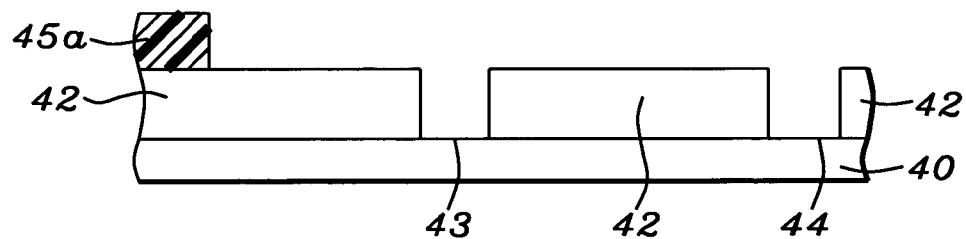
FIG. 15
FIG. 16

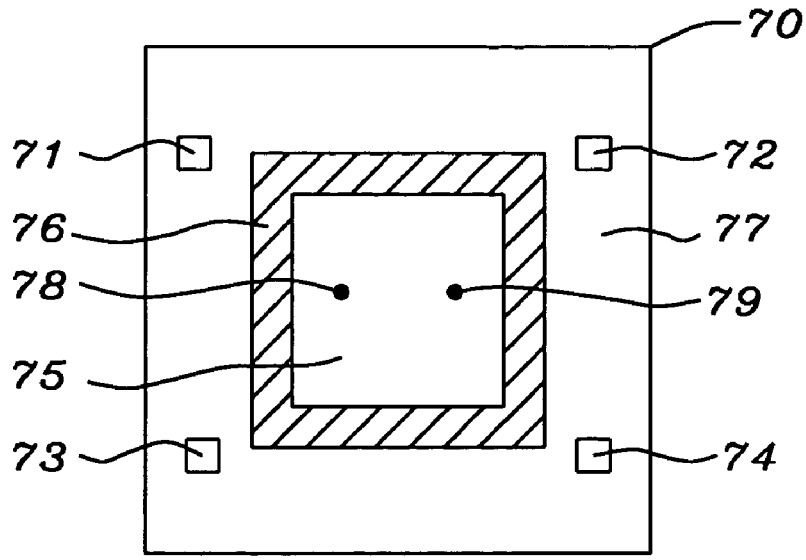
FIG. 17 – Prior Art
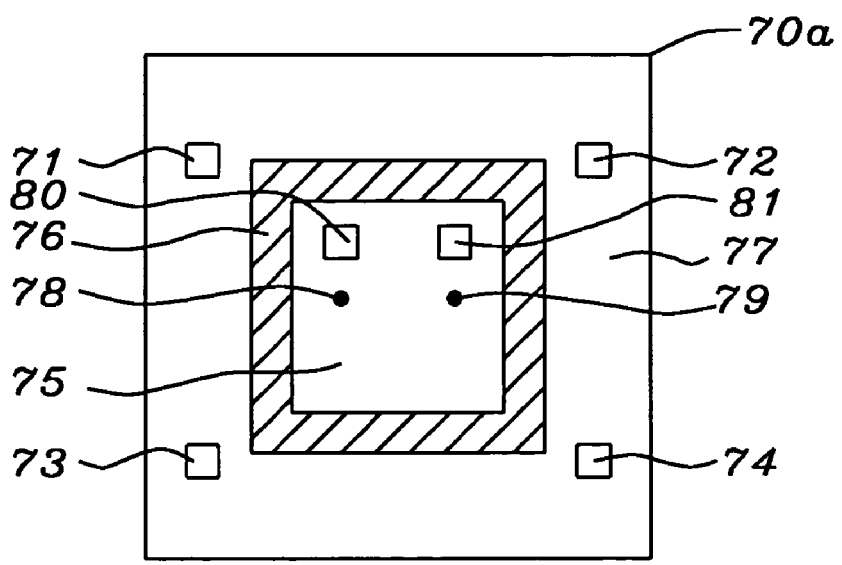
FIG. 18

METHOD OF THE ADJUSTABLE MATCHING MAP SYSTEM IN LITHOGRAPHY

CROSS REFERENCE TO RELATED APPILCATIONS

This application is a division of U.S. patent application Ser. No. 10/725,810, filed Dec. 2, 2003 now U.S. Pat. No. 7,160,654 and entitled "METHOD OF THE ADJUSTABLE MATCHING MAP SYSTEM IN LITHOGRAPHY," which is hereby incorporated by reference.

FIELD OF THE INVENTION

The invention relates to a method of fabricating an integrated circuit in a semiconductor device. More particularly, the present invention relates to a method of more accurately aligning a second layer pattern formed in a photoresist layer on a first layer pattern formed in a substrate.

BACKGROUND OF THE INVENTION

Photoresist patterning is a key step in the formation of integrated circuits in semiconductor devices. A photoresist layer is typically spin coated on a substrate and patternwise exposed by employing an exposure tool and a mask that contains a device pattern. The mask may be comprised of an opaque material such as chrome on a transparent substrate like quartz. Other masks called phase shifting masks have regions that transmit light which is 180° out of phase with light transmitted through an adjacent region. Radiation is transmitted through a mask to selectively expose portions of the photoresist layer which are later developed in a media such as an aqueous base solution to produce a photoresist pattern. For a positive tone photoresist layer, exposed portions are removed while unexposed portions remain on the substrate. With a negative tone photoresist, exposed portions are typically crosslinked and remain on the substrate while unexposed portions are washed away by the developer.

Each technology generation or node in the microelectronics industry is associated with a particular minimum feature size in the photoresist pattern. As technology advances have been continuous in recent years, the minimum feature size requirement has rapidly shifted from 250 nm to 180 nm and then to 130 nm. New photoresists, masks, and exposure tools are now being implemented for 100 nm and sub-100 nm technology nodes.

An important aspect of the photoresist patterning process is the accurate placement of a second layer pattern on a first pattern that formed in a substrate. For example, in a damascene process, trenches formed in a second photoresist layer are overlaid on vias in a first pattern that has been etched into a dielectric layer. As new technology nodes are introduced, the overlay specification for printing a second layer pattern over a first pattern has been tightened to 65 nm or even less in some cases. There are two major factors contributing to this overlay error which is also called layer to layer error. One is optical projection system error and the other is mask to mask error.

In the current practice of evaluating mask to mask error, reference marks are typically placed on a mask outside the pattern and the forbidden area. As shown in FIG. 1, a conventional mask 1 has a pattern area 2 comprised of opaque and transparent regions in a center location which is surrounded by a forbidden area 3 and is used to form a first pattern in a substrate. The outer region 4 of the mask 1 has opaque or transparent reference marks 5a-5f that are not printed during a patterning process. Similarly, a second mask (not shown) which is used to print a second layer pattern has a matching set of reference marks located in an outer region that are at similar (x,y) coordinates to the reference marks 5a-5f on the mask 1. A metrology tool is used to obtain mask to mask overlay without involving photoresist exposures. Thus, the position of each of the reference marks 5a-5f on the mask 1 and the position of the reference marks on the second mask are measured and an offset in terms of an overlay error in the x-direction and in the y-direction is calculated for each matched pair of reference marks. The offset data is used to make a correction in exposure tool settings when using the mask 1 and the second mask in subsequent patterning steps so that the overlay of a second layer pattern on a first pattern is optimized.

The resulting mask to mask error map depicted in FIG. 2 is simplified compared to actual practice but indicates that the same correction is applied to all areas of the mask in region 6 including the device pattern area 2 based on the offset of marks 5a, 5b to the matching reference marks on the second mask. Likewise, only one correction is made for all areas of the mask in region 7 based on measurements of reference marks 5c, 5d and the matching reference marks on the second mask and only one correction is made in region 8 based on the measurements of marks 5e, 5f and the matching reference marks on the second mask. For advanced technologies that are approaching nodes of 100 nm or less, the location of reference marks outside the device pattern does not provide a second layer pattern to first layer pattern overlay accuracy that satisfies current overlay specifications. Therefore, a new method is needed that enables alignment to within about 45 nm of a targeted position.

In U.S. Pat. No. 5,044,750, a method is mentioned for checking alignment of a pattern in a photoresist layer. Geometric patterns in a diamond shape are added to a mask in a progressively overlapping edge to edge orientation with increments of 0.05 microns in distance between the ends of the diamonds. The diamond shapes can be oriented in both x and y directions in order to provide full (x,y) dimension accuracy.

U.S. Pat. No. 6,352,323 provides a method of aligning a mask level to marks in two previous layers. An algorithm with weighting factors is applied to determine overlay offsets in x and y directions.

An in-situ overlay method is described in U.S. Pat. No. 4,929,083. A key step is to monitor the output signal generated by a photodetector in response to light angularly radiated by one or more test patterns on a reusable calibration wafer while the test pattern is being exposed to an aerial image of a matching calibration mask. This process seems best suited for setting up a tool for manufacturing. During actual production, mask to mask error would still have to be evaluated for fine corrections.

In U.S. Pat. No. 6,288,556, electrical resistance is measured to determine the amount of misregistration between two patterned levels. Electrical resistance is measured between terminals provided in first and second level patterns that have been etched into a substrate. A current is applied between two terminals and voltage is monitored between two different terminals in a pattern.

SUMMARY OF INVENTION

One objective of the present invention is to provide a method of determining mask to mask error that improves the accuracy of overlaying a second layer pattern on a first pattern on a semiconductor substrate.

A further objective of the present invention is to provide a method that generates a reference mark within a device pattern and also includes a means of removing the mark from a mask and from a photoresist layer.

A still further objective of the present invention is to provide a method that reduces layer to layer overlay error for printing a second layer pattern on a first layer pattern on a substrate.

These objectives are achieved in a first embodiment by providing a substrate with a first photoresist layer formed thereon. The first photoresist layer is exposed with a first patterned mask having a first reference mark with an essentially square shape formed by a first pair of parallel lines and a second pair of parallel lines that are perpendicular to the first pair of parallel lines. In one embodiment, the first reference mark is comprised of chrome on the first mask and the first photoresist is a positive tone photoresist. In an alternative embodiment, the reference mark is a clear region on the mask and a first reference mark and pattern is formed in a negative tone first photoresist layer. The resulting first photoresist pattern is transferred into the substrate with a plasma etch process and the first photoresist layer is removed. A second photoresist layer is then coated on the patterned substrate and is exposed with a second mask having a second reference mark which is an essentially square shape comprised of a first pair of parallel lines and a second pair of parallel lines that are perpendicular to the first pair of parallel lines. The second reference mark is smaller than the first reference mark and is designed to be printed in the second photoresist layer such that the second reference mark is overlaid on the first reference mark and when observed from a top-down view fits inside the first reference mark in the first pattern and does not overlap any of the lines in the first pattern.

In one embodiment, the first and second reference marks are comprised of chrome and are located in clear regions on the first and second masks, respectively, that are not near any other chrome features. The number and location of the reference marks may be designated by the customer or applied in a design that is selected by the mask maker. Therefore, a plurality of first reference marks equivalent to the first reference mark may be placed on the first mask and a plurality of second reference marks equivalent in shape and size to the second reference mark are placed on the second mask. Each second reference mark on the second mask is matched with a first reference mark at a corresponding location or (x,y) coordinate on the first mask. Although the first and second reference marks are preferably placed inside the patterned area of the first and second masks, respectively, some of the first and second reference marks may be located outside the forbidden area on a mask in order to determine mask to mask error in another embodiment of the invention.

A pattern in a photoresist layer is typically printed at ¼ or ⅕ the size of the corresponding pattern on a mask. Thus, the mask pattern is usually exposed a plurality of times in a stepping movement to produce a plurality of adjacent exposure fields that together cover a majority of the surface area on a substrate. After the second photoresist is developed to generate a second pattern with at least one second reference mark in each printed exposure field, the position of a second reference mark in the second photoresist pattern is determined relative to a matching first reference mark in the substrate by a scanning electron microscope (SEM) with a top-down view which is commonly referred to as a CD-SEM. The offset in terms of x and y deviation of the second reference mark from a center point in a matching first reference mark is measured according to a grid that may be a "m"בn" array of squares, for example, when overlaid on a substrate surface. Since an exposure field is usually larger than a grid square, more than one measurement per exposure field is typically performed.

The measurement results for each grid square are inputted into a correction algorithm that adjusts exposure tool settings such as field rotation, magnification, x and y stage scale, orthogonality, and offset translation for each exposure field in subsequent exposures with the second mask. The exposure tool adjustments will enable a more accurate overlay of the second photoresist pattern on the first pattern when processing subsequent substrates.

In the embodiment in which a chrome second reference mark on a second mask is used to print a second pattern in a positive photoresist layer, the second (positive) photoresist layer is then exposed through a third mask with clear regions in the same locations of the second reference marks in the second mask. The second photoresist layer is developed a second time to remove the second reference marks and leave the desired device pattern in the second photoresist layer.

In a second embodiment, a Leica LMS IPRO tool or an equivalent is employed to obtain mask to mask overlay directly without involving photoresist exposures. The metrology tool uses reflected non-coherent light to determine the x,y coordinates of a feature such as a chrome reference mark on a mask. Thus, the position of each of the first reference marks on the first mask and each of the second reference marks on the second mask is obtained by a Leica LMS IPRO tool or equivalent. An overlay grid is employed as in the first embodiment and the offset results in terms of (x,y) deviations are directly inputted into an algorithm that is used to calculate the appropriate adjustments in exposure tool parameters to produce the desired overlay of the second pattern layer on a first pattern generated from the first mask.

Once the metrology measurements are taken and a second photoresist layer is patterned on a first pattern in a substrate to verify that the Leica LMS IPRO overlay measurements are acceptable, then the second reference marks on the second mask and the first reference marks on the first layer mask may be removed. For example, a photoresist on the first layer mask is patterned by a pattern generator machine such as an e-beam tool to expose portions of the photoresist that correspond to the (x,y) coordinates of the underlying first reference marks. The photoresist is developed to form clear regions that completely uncover the first reference marks but not adjacent device areas. A wet or dry etch process removes the exposed first reference marks. The photoresist layer is stripped and the modified first layer mask may then be used to expose a first photoresist layer on subsequent substrates.

BRIEF DESCRIPTION OF THE DRAWINGS

FIG. 1 is a top-down view of a conventional mask showing a patterned region, a forbidden region and location of reference marks outside the patterned region.

FIG. 2 shows a layer to layer error map produced by a conventional method of measuring reference marks outside a printed pattern.

FIG. 3 is a top-down view of a first layer mask having reference marks inside the patterned area according to a method of the present invention.

FIG. 11a is a grid that is overlaid on a substrate and used to generate a layer to layer error map in FIG. 11b that is produced by inputting measurements according to a method of the present invention.

FIGS. 12 and 13 are top-down views of a third mask that has clear openings which are used to remove the second reference marks in a second layer pattern.

FIGS. 14 and 15 are cross-sectional views depicting how the opening in the third mask is used to remove a second reference mark in a second layer pattern.

FIG. 16 is a mask to mask error table comprised of 4 rows and 4 columns.

FIG. 17 is a top-down view of a conventional mask showing reference marks that are used to make an x-magnification correction.

FIG. 18 is a top-down view of a mask according to the present invention that has reference marks in a device area that are used to make an x-magnification correction.

DETAILED DESCRIPTION OF THE INVENTION

Figure 4:
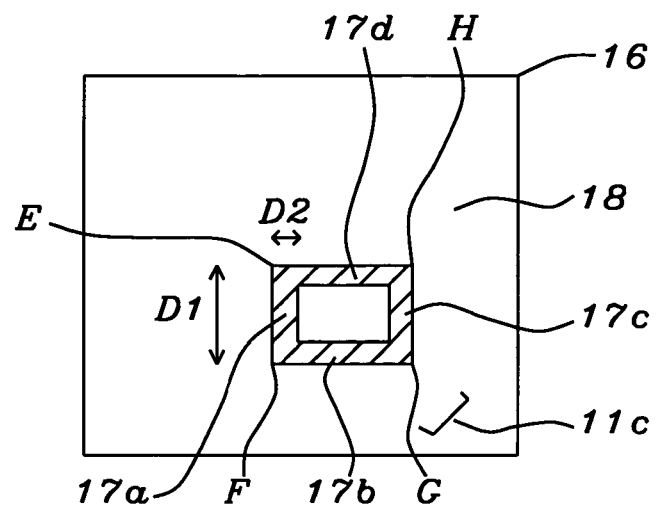
FIG. 4 shows a portion of the first layer mask in FIG. 3 with an enlarged picture of one of the first reference marks.

The present invention is a method of fabricating an integrated circuit which enables the placement of a second layer pattern on a first layer pattern with high accuracy that satisfies overlay requirements for advanced technologies. In a first embodiment, a method that improves layer to layer overlay of a photoresist layer on a patterned substrate will be described. In a second embodiment, a method for improving mask to mask overlay is described. The present invention is also a mask set involving a first layer mask having a first reference mark inside a device pattern, a second layer mask having a second reference mark inside a device pattern, and a third mask used to remove a second reference mark from a second layer pattern in a photoresist layer. It is understood that the term "pattern" may refer to a pattern on a mask, in a photoresist layer, or in a substrate. For the purpose of this invention, a first layer pattern generally refers to a pattern that is transferred from a first layer mask into a first photoresist layer and subsequently etched into a substrate. A second layer pattern is intended to mean a pattern that is transferred from a second layer mask into a second photoresist layer wherein the second layer pattern is overlaid on the first layer pattern in the substrate.

In the first embodiment, a method is provided for determining the overlay error of a second layer pattern on a first layer pattern in a substrate. The error measurements are used to make corrections in exposure tool settings that will generate a more accurate placement of the second layer pattern on the first layer pattern in subsequent substrates. Referring to FIG. 3, a first layer mask 20 is shown that is comprised of an inner first layer pattern area 13, a chrome forbidden area 14, and an outer region 15. The outer region 15 may be opaque or transparent depending on the type of mask. A key feature of the invention is that first reference marks 10b, 10c, 11b, 11c are inserted within the first layer pattern area 13 in order to provide a more accurate determination of layer to layer overlay in a subsequent step. Conventional masks only have reference marks in a region 15 outside the forbidden area 14.

Note that other first reference marks 9a-9d, 10a, 10d, 11a, 11d, and 12a-12d may be placed in the outer region 15 and their use will become apparent during a description of mask to mask overlay in a second embodiment. Although a 2×2 array of first reference marks is shown within the first layer pattern area 13, optionally, an "m"×"n" array may be used. Alternatively, a different sized array of first reference marks may be used instead of the 4×4 array that covers the first layer mask 20.

In one embodiment, the first reference marks are comprised of chrome that is placed on a transparent region of a first layer mask 20. The first reference marks are placed at least 2 microns from any pattern features in the first layer pattern area 13. In an alternative embodiment in which the first layer mask is an attenuated or alternating phase shifting mask, the first reference marks are constructed so that light passing through the marks is transmitted 180° out of phase with light that passes through an adjacent region of the first layer mask 20. In another embodiment, the first reference marks may be clear regions of the first layer mask 20 that are surrounded by chrome.

Referring to FIG. 4, in the exemplary embodiment, the first reference marks are comprised of chrome on a transparent substrate. A portion 16 of the first layer pattern area 13 is shown that includes the first reference mark 11c. Note that all first reference marks have the same size and shape as the first reference mark 11c. The first reference mark 11c is preferably comprised of a first pair of parallel chrome lines 17a, 17c and a second pair of parallel chrome lines 17b, 17d that are perpendicular to chrome lines 17a, 17c and form an essentially square shape having corners E, F, G, H. The length of one side D1 between corners E and F, for example, is about 80 microns. The width D2 of each of the chrome lines 17a-17d is about 8 microns.

Figure 5A:
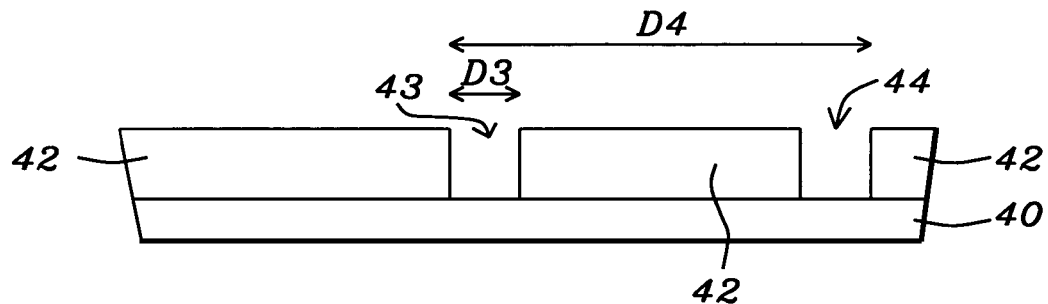
FIGS. 5a-5b are cross-sectional views of a first reference mark formed in a first layer pattern on a substrate.

Referring to FIG. 5a, a substrate 40 is depicted that is typically monocrystalline silicon and may have active and passive devices (not shown). A first layer 42 is formed on substrate 40 and may be a dielectric layer, for example. The first layer mask 20 is used to pattern the first layer 42 by a conventional method of patterning a photoresist layer (not shown) on the first layer 42 and transferring the pattern into the first layer with a plasma etch process. When a positive tone photoresist is exposed, a developer solution removes the exposed regions while unexposed regions remain on the substrate. For a negative tone photoresist, the exposed regions remain on the substrate after development and the unexposed regions are removed. After the etch transfer step, the remaining photoresist layer is removed by an ashing method or an organic stripper solution. As a result, the pattern in the first layer mask 20 and the first reference marks within the first layer pattern area 13 are formed in the first layer 42.

In the exemplary embodiment, a portion of the first layer 42 that includes openings 43, 44 corresponding to lines 17a, 17c, respectively, on the first layer mask is shown. Openings 47, 48 corresponding to lines 17b, 17d, respectively, on the first layer mask 20 are also formed in the first layer 42 but are not pictured in this view. In this example, a chrome line 17a, 17c on a first layer mask 20 may be used to expose a negative tone photoresist on the first layer 42 and subsequently form openings 43, 44. In the alternative embodiment where first reference marks are transparent lines surrounded by chrome, transparent lines with similar size and shape to lines 17a, 17c on a first layer mask 20 are used to pattern a positive tone photoresist on the first layer 42 and subsequently form the openings 43, 44.

It is understood that the pattern projected by the exposure tool is typically ¼ or {fraction (⅕)} of the size of the first layer pattern on the mask. Therefore, a first reference mark which is an 80×80 micron square on the first layer mask 20 is reduced to a 20×20 micron square first reference mark in a first layer 42 on a substrate 40 when the exposure tool has 4:1 reduction optics. For 5:1 reduction optics, a first reference mark that forms an 80×80 micron square on the first layer mask 20 would become a 16×16 micron square size in the first layer 42. In other words, the first reference mark as printed in first layer 42 has a width D4 of 20 microns and a width D3 for an opening 43 or 44 of 2 microns in the example where an 80 micron square first reference mark on the first layer mask 20 is exposed by an exposure tool with 4:1 reduction optics. Furthermore, the first layer pattern is typically "stepped" or printed in a plurality of adjacent exposure fields across the substrate 40 as is appreciated by those skilled in the art so that a first reference mark 11c, for instance, is reproduced a plurality of times in a first layer 42.

Figure 5B:
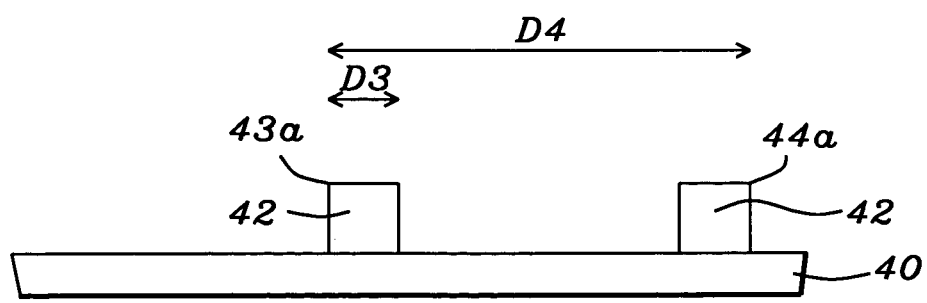

In an alternative embodiment shown in FIG. 5b, lines 43a, 43b corresponding to lines 17a, 17c, respectively, on the first layer mask 20 are formed in the first layer 42. In this case, a chrome line 17a, 17c on a first layer mask 20 may be used to expose a positive tone photoresist on the first layer 42 and subsequently form lines 43a, 44a. In the alternative embodiment where first reference marks are transparent openings surrounded by chrome, transparent openings with similar length and width to lines 17a, 17c on a first layer mask 20 are used to pattern a negative tone photoresist on the first layer 42 and subsequently form lines 43a, 44a.

Figure 6:
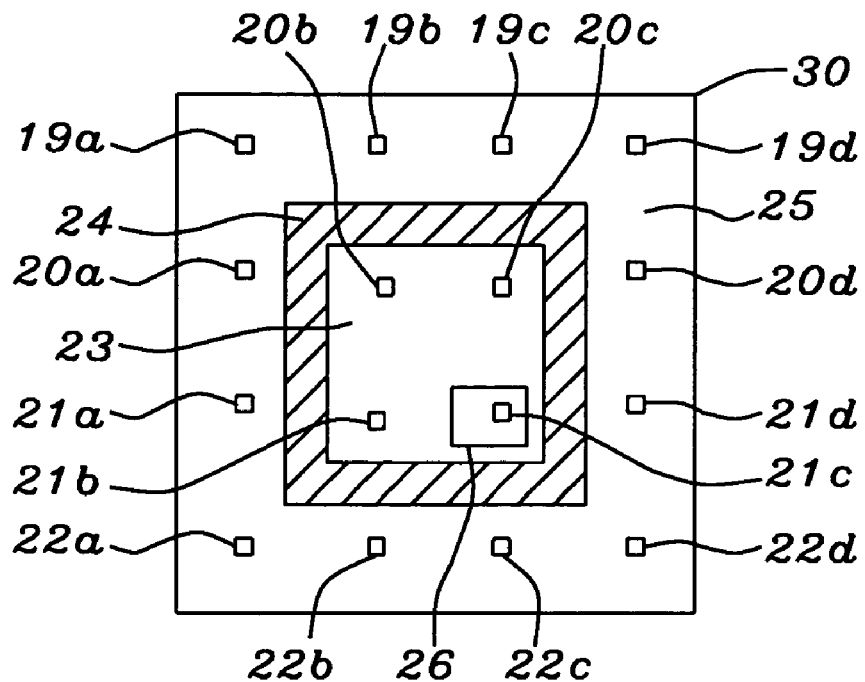
FIG. 6 is a top-down view of a second layer mask having second reference marks according to a method of the present invention.

Referring to FIG. 6, a second layer mask 30 is shown that is comprised of an inner second layer pattern area 23, a chrome forbidden area 24, and an outer region 25. The outer region 25 may be opaque or transparent depending on the type of mask. Another key feature of the invention is that second reference marks 20b, 20c, 21b, 21c are inserted within the second layer pattern area 23 in order to provide a more accurate determination of layer to layer overlay in a subsequent step. Note that other second reference marks 19a-19d, 20a, 20d, 21a, 21d, and 22a-22d may be placed in the outer region 25 and their use will become apparent during a description of mask to mask overlay in a second embodiment. Conventional masks only have reference marks in a region 25 outside the forbidden area 24.

Although a 2×2 array of second reference marks is shown within the second pattern layer area 23, optionally, an "m"×"n" array may be used. Alternatively, a different sized array of second reference marks may be used instead of the 4×4 array that covers the second layer mask 30. However, it is important that the same size array of first and second reference marks are employed. Furthermore, each second reference mark having an (x,y) coordinate on the second layer mask 30 is matched with a first reference mark having the same (x,y) coordinate on the first layer mask 20.

In one embodiment, the second reference marks are comprised of chrome that is placed on a transparent region of a second layer mask 30. It is understood that the second reference marks are not placed near any device features in the second layer pattern area 23. In an alternative embodiment in which the second layer mask is an attenuated or alternating phase shifting mask, the second reference marks are fabricated so that light passing through the marks is transmitted 180° out of phase with light that passes through an adjacent region of the second layer mask 30. In yet another embodiment, the second reference marks may be clear regions on the second layer mask 30 that are surrounded by chrome.

Figure 7:
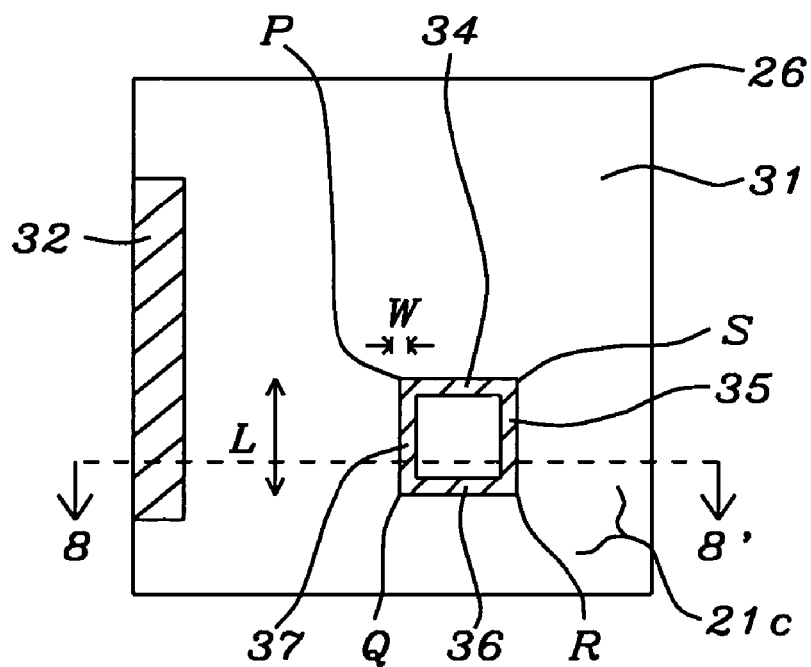
FIG. 7 depicts a portion of the second layer mask in FIG. 6 and shows an enlarged picture of one of the second reference marks.

Referring to FIG. 7, in the exemplary embodiment, the second reference marks are comprised of chrome on a transparent substrate. A portion 26 of the second layer pattern area 23 is shown that includes the second reference mark 21c and a portion of a pattern feature 32. The pattern feature 32 is preferably at least 2 microns from the second reference mark 21c. Similarly, all other pattern features (not shown) are at least 2 microns from a second reference mark. Note that all second reference marks have the same size and shape as the second reference mark 21c. A second reference mark 21c is preferably comprised of a first pair of parallel chrome lines 34, 36 and a second pair of parallel chrome lines 35, 37 that are perpendicular to the lines 34, 36 and form an essentially square shape having corners P, Q, R, S. The length of one side L between corners P and Q, for example, is about 40 microns. The width w of each of the chrome lines 34-37 is about 2 microns. Region 23 represents a transparent portion of the substrate 30. In general, first and second reference mark placement depends upon the customer who will use the final device or are positioned according to the mask designer or by the mask maker.

An example is given in FIGS. 8-11 of how layer to layer overlay error of a second layer pattern on a first layer pattern is determined. Layer to layer overlay error includes mask to mask overlay error and errors from imperfect optics in the exposure tool during the patterning process. Mask to mask overlay error may be determined separately as described in the second embodiment.

Figure 8:
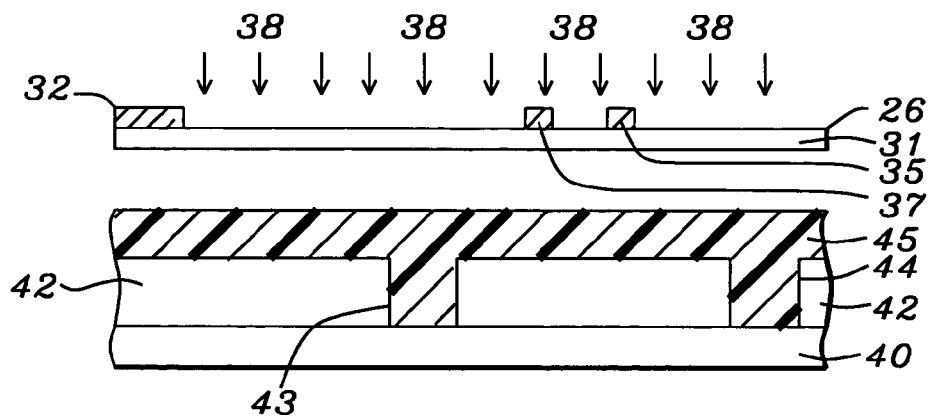
FIG. 8 is a cross-sectional view showing a second layer mask with a second reference mark aligned over a first reference mark in a substrate.

Referring to FIG. 8, the substrate 40 with the first layer 42 that has a first pattern with a first reference mark comprised of openings 43, 44 is coated with a second photoresist layer 45 and exposed with radiation 38 that is usually one or more wavelengths between about 10 nm and 450 nm. Optionally, an electron beam or ion beam exposure may be used to pattern the second photoresist layer 45. The second photoresist layer 45 fills the openings 43, 44 and openings 47, 48 (not shown) and preferably has a uniform thickness on the first layer 42. The cross-sectional view of the second layer mask 30 is shown as is generated by the cross-section A-A' in FIG. 7.

In the exemplary embodiment, the chrome lines 35, 37 from a second reference mark 21c in the second layer mask 30 are aligned over a first alignment mark 11c (openings 43, 44) in the first layer 42. Also pictured is the pattern feature 32 and the transparent substrate 31 on which a chrome second layer pattern is formed. In an alternative embodiment, the second reference marks including the second reference mark 21c are clear openings surrounded by chrome on the second layer mask 30. Optionally, the second layer mask 30 may be phase shifting in which the second reference marks transmit light that is 180° out of phase with light transmitted through adjacent portions of the second layer mask.

Figure 9:
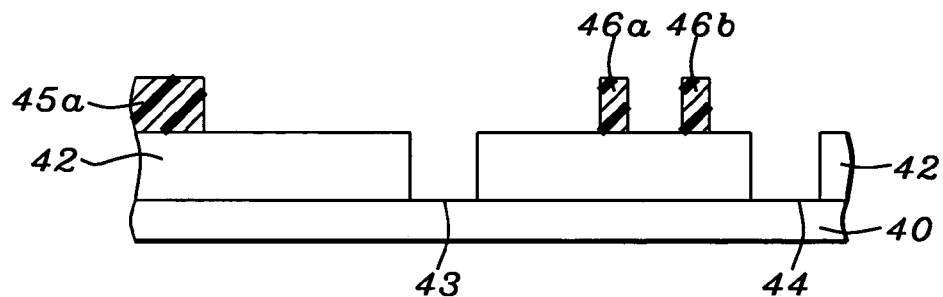
FIGS. 9 and 10 are a cross-sectional view and top-down view, respectively, showing some overlay error has occurred in forming a second layer pattern with a second reference mark over a first pattern with a first reference mark.

Referring to FIG. 9, the positive tone second photoresist 45 is typically subjected to a post-expose bake step and is then developed with an aqueous base solution to selectively remove portions of the second photoresist layer 45 that were exposed radiation 38. As a result, the pattern feature 45a and lines 46a, 46b are formed in the second photoresist layer. Other portions of the second layer pattern and other second reference marks within the second pattern layer area 23 on the second layer mask 30 are also exposed by radiation 38. The resulting second layer pattern in the second photoresist layer 45 is not pictured in order to simplify the drawing. In the alternative embodiment where the second reference marks are clear regions on the second layer mask 30, a negative tone photoresist is exposed and developed to form lines 46a, 46b.

As described previously, the first layer mask 20 may be used to print a first reference mark comprised of lines 43a, 44a in the first layer 42. The second layer mask 30 may be employed to print lines 46a, 46b in a second photoresist layer 45 in which the lines 46a, 46b are positioned between lines 43a, in the first layer 42. Alternatively, a first reference mark may be comprised of spaces in the first layer 42 and a second reference mark may be comprised of spaces in the second layer 45.

Figure 10:
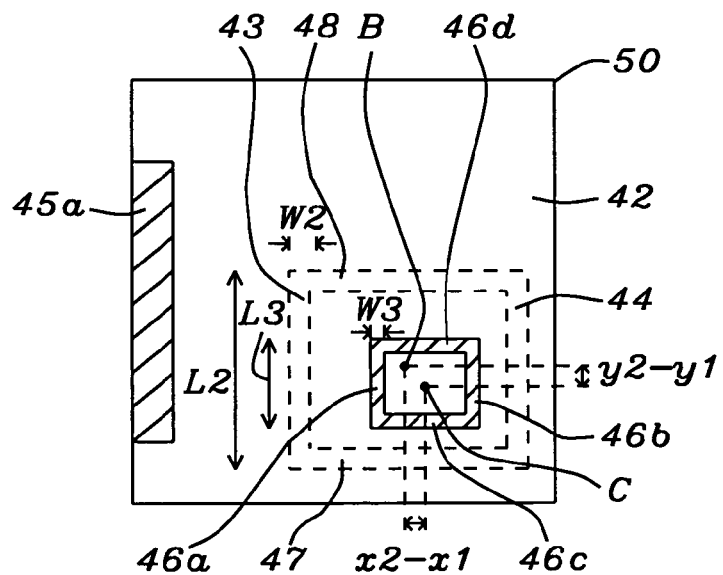

Referring to FIG. 10, a top-down view is provided of the portion 50 of the substrate 40 in FIG. 9 in which a second photoresist layer has been patterned over a first layer 42. The first reference mark comprised of the openings (trenches) 43, 44, 47, 48 in the first layer 42 is represented by the large dashed lines and has a center point B at coordinates $(x_1, y_1)$ which is midway between the openings 43, 44 and midway between the openings 47, 48. The second reference mark that is comprised of the second photoresist lines 46a-46d has a center point C at coordinates $(x_2, y_2)$ which is equidistant from the four lines 46a-46d. The trenches 43, 44, 47, 48 have a length L2 and a width W2 that are about 20 microns and about 2 microns, respectively, while the second reference mark which is comprised of the second photoresist lines 46a-46d has a length L3 of about 10 microns and a width W3 of about 0.5 microns. The exact size of the first and second reference marks is not critical so long as the first and second reference marks are easily recognized when a patterned substrate is viewed top-down with a CD-SEM.

In an ideal situation, center point C is overlaid exactly on center point B. However, center point C is usually offset from center point B by a distance in the y direction $(y_2-y_1)$ and by a distance in the x direction $(x_2-x_1)$ because of aberrations in the optics of the exposure tool and due to mask to mask overlay error. The magnitude Of $(y_2-y_1)$ and $(x_2-x_1)$ is called layer to layer overlay error. Layer to layer overlay error is preferably recorded not only for the second reference mark 21c overlay on the first reference mark 11c, but also for second reference mark 21b overlay on first reference mark 11b, second reference mark 20b overlay on first reference mark 10b, and for second reference mark 20c overlay on first reference mark 10c.

In an example where there is only one exposure field per substrate 40 and four second reference marks 20b, 20c, 21b, 21c in the second photoresist layer 45 which are overlaid on four first reference marks 10b, 10c, 11b, 11c, respectively, in a first layer 42, then four sets of measurements are taken with a CD-SEM. In addition to measuring one set of (x, y) coordinates for the center point C of second reference mark 21c and the center point B of first reference mark 11c as mentioned previously, three other sets of (x, y) coordinates are measured for the remaining three matched pairs of first and second reference marks which are (20b, 10b), (20c, 10c), and (21b, 11b). The (x, y) coordinates for the center points (not shown) of first reference marks 10b, 10c, and 1b are $(x_5, y_5)$, $(x_7, y_7)$, and $(x_3, y_3)$, respectively. The (x, y) coordinates for the center points (not shown) of the second reference marks 20b, 20c, and 21b are $(x_6, y_6)$, $(x_8, y_8)$, and $(x_4, y_4)$, respectively.

Referring to FIG. 11a, a grid 90 which is divided into four equal squares 91, 92, 93, 94 is overlaid on the second layer pattern (not shown) on substrate 40. In this case, the matched pairs of first and second reference marks (20b, 10b), (20c, 10c), (21b, 11b), and (21c, 11c) fall inside the squares 91, 93, 92, and 94, respectively.

Referring to FIG. 11b, a table is generated in which the x and y deviations are inserted for each of the matched pair of first and second reference marks according to the grid 90 in FIG. 11a. The x deviation between the center points for first reference mark 10b and for second reference mark 20b is represented by $(x_6-x_5)$ and is placed in row $a_1$ under column $b_1$. In a similar fashion, the x deviation between the center points for first reference mark 10c and for second reference mark 20c is represented by $(x_8-x_7)$ and is placed in row $a_1$ under column $b_1$. The x deviation between the center point for first reference mark 11b and for second reference mark 21b is $(x_4-x_3)$ and is inserted in row $a_2$ under column $b_1$. Finally, the fourth x deviation $(x_2-x_1)$ as previously described is inserted in row $a_2$ under column $b_2$. Similarly, the values $(y_8-y_7)$, $(y_6-y_5)$, $(y_4-y_3)$, and $(y_2-Y_1)$ for the corresponding y deviations are placed in appropriate row and column positions. The resulting x and y deviations (offset values) are typically expressed in terms of nanometers (nm) and may be a negative or a positive number.

Once all the x and y deviations for the first and second reference marks have been entered into the table, the data is inputted into a correction algorithm in a computer. The algorithm automatically calculates adjustments such as changes to magnification, field rotation, x and y stage scale, orthogonality, and offset translation in the exposure settings that will enable a more precise placement of the second layer mask 30 over a first layer pattern in first layer 42 in subsequent exposures on other substrates.

In the embodiment where the first layer pattern in the first layer mask and the second layer pattern in the second layer mask are stepped across a substrate during the patterning steps to produce a plurality of exposure fields, each first reference mark and each second reference mark is reproduced a plurality of times in the first layer and second photoresist layer, respectively. Furthermore, a plurality of reference marks may be placed inside the inner pattern area on the first layer mask and inside the inner pattern area on the second layer mask. Accordingly, a larger grid that is "m" rows by "n" columns, for example, may be selected that overlays essentially the entire substrate. Note that the area of one square within a grid may be smaller than the size of an exposure field and that a plurality of reference marks may fall inside each square within the grid. Therefore, a plurality of CD-SEM measurements are needed to obtain the (x,y) coordinates of the center point for each first and second reference mark in the first layer and second photoresist layer, respectively. Obviously, this procedure is preferably automated to move from one reference mark site on a substrate to another in order to achieve a faster determination of x and y deviations. As before, the results are tabulated so that the data may be fed into a correction algorithm to make the necessary adjustments for subsequent exposures. It is understood that when a plurality of measurements are taken within a grid square, the results may be averaged for the measurements so that one x deviation value and one y deviation value are entered into the corresponding row and column of the error table.

Those skilled in the art will appreciate that more than one exposure tool is typically required for exposing a group of substrates with a first layer mask and a second layer mask. For example, a first tool may be paired with the first layer mask and the second layer mask for processing one lot of wafers and a second tool may be paired with the first layer mask and the second layer mask for processing another lot of wafers. Thus, the method of the first embodiment is preferably performed at least once for each combination of exposure tool, first layer mask, and second layer mask. Depending on the alignment stability of the exposure tool, the method may be repeated on a regular basis to track the optimum exposure settings for the exposure tool.

Referring to FIG. 12, a third mask 50 is used to expose the substrate 40 having a patterned layer 45 on its surface in order to remove the second reference marks 20b, 20c, 21b, 21c that are not wanted in the final device. Mask 50 has a transparent outer region 52 and a chrome region 51 whose shape and size corresponds to combined regions 23, 24 on the second layer mask 30. The chrome region 51 is further comprised of small openings 53, 54, 55, 56 that are slightly larger than the second reference marks 20b, 20c, 21b, 21c and are located in positions on mask 50 which have the same (x, y) coordinates as the second reference marks 20b, 20c, 21b, 21c on the second layer mask 30. For instance, when the third mask 50 is aligned over the second layer mask 20, then the opening 53 would overlay on the second reference mark 20b.

In the alternative embodiment where a plurality of second reference marks are located on the inner pattern area 23 of the second layer mask 30, then there are a plurality of openings in the third mask 50 in which one opening is matched with a second reference mark with the same (x,y) coordinates on the inner pattern area 23 of the second layer mask 30. Note that second reference marks in the outer region 25 of the second layer mask 30 are not printed in the photoresist layer 45.

Referring to FIG. 13, a portion 60 of the chrome region 51 on the third mask 50 is shown that is identical in shape and size to the portion 26 of the mask 30 depicted in FIG. 6. The transparent opening 56 is slightly larger than the second reference mark 21c in FIG. 6 to allow for some overlay error. The shape and size of each of the openings 53, 54, 55, 56 may vary but must be large enough to expose an entire second reference mark in the second photoresist layer 45 but not so large as to expose part of an adjacent pattern feature.

Referring to FIG. 14, the substrate 40 with a second patterned layer comprised of the second reference mark 21c (lines 46a-46d) on the first patterned layer 42 is exposed with radiation 61 through a portion 60 of the third mask 50. Chrome regions 51 prevent radiation 61 from exposing the portions of photoresist layer 45 containing pattern features. The opening 56 allows radiation to expose second reference mark 21c consisting of lines 46a, 46c. Lines 46b, 46d (not shown) are also exposed through the opening 56. The second reference marks 20b, 20c, 21b are simultaneously exposed through openings 53, 54, 55, respectively. Following exposure, the substrate is developed with an aqueous base solution to selectively remove lines 46a-46d. The device pattern that includes the pattern feature 45a remains on the first layer 42. During the same developer treatment, all other second reference marks formed by exposing the second layer mask 30 with radiation 38 as depicted in FIGS. 8-9 are removed to leave only the desired second layer pattern.

Once the second reference marks are removed, the second photoresist layer 45 is processed by conventional means which typically involves using the patterned second photoresist layer 45 as a mask while etching the exposed portions of the first layer 42 and then using a wet or dry strip process to remove any remaining portions of the second photoresist layer 45. For example, the first pattern may be comprised of a via and the second layer pattern may be comprised of a trench that is formed above the via.

The advantage of this method is that second reference marks may be placed in a second layer pattern to improve the overlay of the second layer pattern on a first layer pattern and may then be removed in order not to interfere with final device performance. The overlay of the second layer pattern on the first layer pattern is improved in subsequent exposures on other substrates. For example, the method of the first embodiment could be performed on a first wafer in a multiple wafer lot. After a layer to layer error map is generated according to the previously described method for the first wafer and the data is inputted into a correction algorithm to make adjustments in exposure settings, other wafers in the lot can then be exposed with the first layer mask and then the second layer mask. As a result, a smaller placement error will be achieved for printing the second layer pattern over the first layer pattern on other wafers in the same lot and in subsequent lots.

In a second embodiment, the mask to mask error contribution to the layer to layer overlay error is determined with the use of a Leica LMS IPRO tool or an equivalent. The metrology tool uses reflected non-coherent light to determine the (x,y) coordinates of a feature such as a chrome reference mark on a mask. Thus, the position of each of the first reference marks on the first layer mask 20 and each of the second reference marks on the second layer mask 30 is obtained without exposing a substrate.

Referring to FIG. 16, in the embodiment where the first reference marks and the second reference marks each form a 4×4 array, the center point positions (x and y coordinates) of all the first reference marks 9a-9d, 10a-10d, 1a-11d, 12a-12d on the first layer mask 20 and the center point locations (x and y coordinates) of all the second reference marks 19a-19d, 20a-20d, 21a-21d, 22a-22d on the second layer mask 30 are determined by a Leica LMS IPRO or equivalent. An error table comprised of 4 rows and 4 columns is generated by obtaining the x and y deviations for each matching pair of the aforementioned center points and entering the values in the appropriate column and row of the table. For example, the (x,y) offset values for the second reference mark 19a with respect to first reference mark 9a is entered in row $m_1$ under column $n_1$. Similarly, the (x,y) offset values for the second reference mark 20a with respect to the first reference mark 10a are entered in row $m_2$ under column $n_1$. The remaining (x,y) offset values are placed in the corresponding column and row.

An algorithm is then used to calculate the appropriate adjustments in exposure tool parameters that will minimize the mask to mask error contribution to the resulting layer to layer overlay error when the second layer mask is used to pattern a photoresist layer coated on a substrate that has been patterned with the first layer mask.

In an alternative embodiment, the first layer mask is comprised of a plurality of first reference marks located on the inner pattern area and outside the forbidden area. Likewise, the second layer mask is comprised of a plurality of second reference marks located on the inner pattern area and outside the forbidden area. Furthermore, each of the second reference marks is matched with a first reference mark at a similar (x,y) coordinate as described in the first embodiment. When an "m"×"n" array of first and second reference marks is placed on the first layer mask and second layer mask, respectively, then the Leica LMS IPRO or equivalent is used to determine the x and y deviations for each matched pair of reference marks and a mask error table with "m" rows and "n" columns is generated. The correction algorithm then makes adjustments to the exposure tool settings for subsequent exposures with the second layer mask.

An example of the improved overlay accuracy provided by the method of the second embodiment will now be described with reference to FIGS. 17 and 18. FIG. 17 depicts a conventional mask 70 that has reference marks 71, 72, 73, 74 located outside the inner pattern area 75 and outside the forbidden area 76 in an outer region 77. There are also two features 78, 79 in the second layer mask pattern within the inner pattern area 75 whose location in a patterned photoresist layer can be monitored to check the effectiveness of an overlay correction. A Leica LMS IPRO or equivalent determines the (x,y) coordinates for the reference marks 71, 72, 73, 74 and a matching set of reference marks in a first layer mask (not shown). The x and y deviations of the reference marks 71, 72, 73, 74 with respect to the matching set of reference marks in the first layer mask is inputted into an algorithm which calculates the optimum exposure settings needed to minimize layer to layer error for a second layer pattern on a first layer pattern. The second layer mask 70 is used to expose a photoresist layer on a first layer pattern in a substrate (not shown).

In the example provided in FIG. 17, calculations derived from the algorithm indicate that an x-magnification correction of 0.8 ppm during exposure of the second layer mask is needed in order to reduce the x-deviation or residue error from 100 nm to 4 nm for overlaying the second layer pattern in a photoresist layer on the first layer pattern. However, when this adjustment is made in the patterning step, the residue error of the printed features 78, 79 which had been 50 nm without correcting for mask to mask error is increased to 82 nm after applying the mask to mask error corrections. Therefore, correcting a mask to mask error based on measurements of reference marks outside the forbidden area may have a detrimental effect on the layer to layer overlay of actual features in the device pattern as observed in this case.

Referring to FIG. 18, the inventors have found that by including reference marks inside the device pattern in the measurements used to determine (x,y) deviations for the mask to mask error table, a positive impact is achieved in reducing layer to layer overlay of a second layer pattern on a first layer pattern. In one embodiment, two additional reference marks are inserted on the first layer mask and on the second layer mask at similar locations. In the example in FIG. 18, a second reference mark 80 is added to the modified second layer mask 70a near pattern feature 78 and a second reference mark 81 is added near pattern feature 79. A matching pair of first reference marks are added to the first layer mask (not shown) at similar (x,y) coordinates. The sequence of obtaining the Leica LMS IPRO measurements for six second reference marks 71, 72, 73, 74, 80, 81 and their matching first reference marks on the modified second layer mask 70a, inputting the (x,y) offsets into a mask error table, and calculating optimized exposure settings with an algorithm is performed.

The modified second layer mask 90 and the optimized exposure settings are used to expose a photoresist layer on a substrate that has been patterned with the first layer mask and its six first reference marks. In this case, the algorithm calls for an x-magnification correction of 0.5 ppm to reduce the x-deviation or residue error from 100 nm to 40 nm for overlaying the second layer pattern on the first layer pattern. When this adjustment is made, the resulting second layer pattern has a more accurate overlay on the first layer pattern since the residue error for device features 78, 79 is reduced to 70 nm rather than 82 nm as previously described for the method with conventional reference marks.

The second embodiment further provides for a method of removing a first reference mark from a first layer mask and a second reference mark from a second layer mask. Although a method is described with regard to a first layer mask, the method also applies to a second layer mask. First, a photoresist layer (not shown) which preferably has a positive tone composition is coated on the first layer mask. A pattern generator machine is employed to direct an electron beam or a laser beam at selected portions of the photoresist layer that correspond to the (x,y) coordinates of the first reference marks on the first layer mask. The electron beam or laser beam exposes an area at each (x,y) coordinate that is slightly larger than the underlying first reference mark to allow for some placement error. It is important not to expose a portion of the photoresist layer that is so large as to overlap a portion of the pattern features on the first layer mask. Therefore, if a plurality of first reference marks is formed in an "m"×"n" array on the inner pattern area of the first layer mask, a plurality of clear regions is formed in an "m"×"n" array in the photoresist layer at the same (x,y) coordinates as the plurality of first reference marks. The clear regions are formed by developing the exposed photoresist layer by a conventional method and removing the exposed portions thereof. Each clear region has a size that completely uncovers a first reference mark.

Note that a first reference mark which is located in an outer region outside the forbidden area does not have to be removed since these first reference marks are not printed when the mask is used in a subsequent exposure. The remaining portions of the photoresist layer then function as a mask while a wet or dry etch process is employed to remove the exposed first reference marks. Finally, the photoresist is stripped by a conventional method and the modified second layer mask is ready for patternwise exposures to form a second layer pattern in a second photoresist layer on a substrate having a first patterned layer. The advantage of this method is that a patterned second photoresist layer does not have to be exposed with a third mask as explained previously which is convenient when a plurality of substrates with a second layer pattern are processed on a regular basis.

While this invention has been particularly shown and described with reference to, the preferred embodiment thereof, it will be understood by those skilled in the art that various changes in form and details may be made without departing from the spirit and scope of this invention.

I claim:

1. A method for determining mask to mask error for improving the overlay of a second layer pattern on a first layer pattern formed in a substrate, said first layer pattern is formed by exposing a first photoresist layer through a first layer mask and transferring the first layer pattern into a substrate and the second layer pattern is formed by exposing a second photoresist layer with a second layer mask, comprising:

(a) providing a first layer mask comprised of an inner pattern area, an outer region, and a plurality of first reference marks formed within the inner pattern area and on the outer region, said first reference marks each have a center point with (x,y) coordinates;

(b) providing a second layer mask comprised of an inner pattern area, an outer region, and a plurality of second reference marks each formed within the inner pattern area and on the outer region wherein each second reference mark is matched with a first reference mark and has a center point with the same (x,y) coordinates as a matching first reference mark on the first layer mask;

(c) measuring the (x,y) coordinates for the center points of the first reference marks and second reference marks and determining the offset values in terms of x and y deviations for each matched pair of first and second reference marks; and (d) inputting the offset values into an error table and applying a correction algorithm to the data in the error table which calculates adjustments in exposure tool settings that are subsequently used to expose a second layer pattern with the second layer mask on a first layer pattern in a substrate that has been formed with the first layer mask.

2. The method of claim 1 wherein said first reference marks on the first layer mask and said second reference marks on the second layer mask are clear regions that are surrounded by chrome and the first layer mask and second layer mask are binary masks.

3. The method of claim 1 wherein said first reference marks on the first layer mask and said second reference marks on the second layer mask are comprised of chrome that is surrounded by clear regions and the first layer mask and second layer masks are binary masks.

4. The method of claim 1 wherein said first reference marks on the first layer mask and said second reference marks on the second layer mask are regions that transmit light which is 180° out of phase with light that is transmitted through adjacent regions and the first layer mask and second layer mask are phase shifting masks.

5. The method of claim 1 wherein each of said first reference marks on the first layer mask and second reference marks on the second layer mask is comprised of a first pair of parallel lines oriented along an x-axis and a second pair of parallel lines oriented along a y-axis that intersect with said first pair of parallel lines to form a square shape and wherein said first and second pair of parallel lines have a length and a width.

6. The method of claim 5 wherein a first reference mark on the first layer mask is comprised of parallel lines having a width of about 8 microns and a length of about 80 microns.

7. The method of claim 5 wherein a second reference mark on the second layer mask is comprised of parallel lines having a width of about 2 microns and a length of about 40 microns.

8. The method of claim 5 wherein said all of said first reference marks on the first layer mask have the same length and width and wherein all of the second reference marks on the second layer mask have the same length and width.

9. The method of claim 1 wherein a Leica LMS IPRO metrology tool or equivalent is used to measure the (x,y) coordinates for the center point of each first reference mark and each second reference mark.

10. The method of claim 1 wherein the plurality of first reference marks are formed in a "m"×"n" array on the first layer mask and the plurality of second reference marks are formed in a "m"×"n" array on the second layer mask and wherein said error table is comprised of "m" rows and "n" columns.

11. The method of claim 1 further comprised of removing the second reference marks on the second layer mask after the correction algorithm is applied by a process comprising:

coating said second layer mask with a third photoresist layer and using a pattern generator machine to expose portions of the third photoresist layer at regions corresponding to the (x,y) coordinates of the second reference marks on the second layer mask;

removing the exposed portions of said third photoresist layer;

performing a dry or wet etch to remove the second reference marks on the second layer mask; and stripping the third photoresist layer.

12. The method of claim 1 further comprised of removing the first reference marks on the first layer mask after the correction algorithm is applied by a process comprising:

coating said first layer mask with a third photoresist layer and using a pattern generator machine to expose portions of the third photoresist layer at regions corresponding to the (x,y) coordinates of the first reference marks on the first layer mask;

removing the exposed portions of said third photoresist layer;

performing a dry or wet etch to remove the first reference marks on the first layer mask; and stripping the third photoresist layer.

* * * * *